(12) United States Patent
Preuthen et al.

(10) Patent No.: US 10,114,919 B2
(45) Date of Patent: Oct. 30, 2018

(54) PLACING AND ROUTING METHOD FOR IMPLEMENTING BACK BIAS IN FDSOI

(71) Applicant: GLOBALFOUNDRIES Inc., Grand Cayman (KY)

(72) Inventors: Herbert Johannes Preuthen, Munich (DE); Stefan Block, Munich (DE); Ulrich Hensel, Dresden (DE); Christian Haufe, Dresden (DE); Fulvio Pugliese, Munich (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 92 days.

(21) Appl. No.: 15/042,815

(22) Filed: Feb. 12, 2016

(65) Prior Publication Data
US 2017/0235865 A1  Aug. 17, 2017

(51) Int. Cl.
*G06F 17/50* (2006.01)
*G06F 1/32* (2006.01)

(52) U.S. Cl.
CPC ...... *G06F 17/5072* (2013.01); *G06F 17/5077* (2013.01); *G06F 1/3296* (2013.01); *G06F 17/5045* (2013.01); *G06F 17/5068* (2013.01)

(58) Field of Classification Search
CPC .............. G06F 17/5045; G06F 1/3296; G06F 17/5068; G06F 17/5072; G06F 17/5077
See application file for complete search history.

(56) References Cited

U.S. PATENT DOCUMENTS

| | | | |
|---|---|---|---|
| 6,560,753 B2 | 5/2003 | Barney et al. | |
| 8,443,306 B1* | 5/2013 | Dhong | H01L 27/11807 257/206 |
| 8,482,070 B1* | 7/2013 | Flatresse | H01L 21/8228 257/351 |
| 9,368,625 B2* | 6/2016 | Louie | H01L 21/26586 |
| 9,425,189 B1* | 8/2016 | Moll | H01L 21/823481 |
| 9,514,942 B1* | 12/2016 | Smith | H01L 21/28123 |

(Continued)

OTHER PUBLICATIONS

Fenouillet-Beranger et; "Parasitic bipolar impact in 32nm undoped channel Ultra-Thin BOX (UTBOX) and biased ground plane FDSOI high-k/metal gate technology"; Year: 2011; 2011 Proceedings of the European Solid-State Device Research Conference (ESSDERC); pp. 111-114.*

(Continued)

*Primary Examiner* — Helen Rossoshek
(74) *Attorney, Agent, or Firm* — Amerson Law Firm, PLLC

(57) ABSTRACT

The present disclosure provides a placing and routing method for implementing back bias in fully depleted silicon-on-insulator. In accordance with some illustrative embodiments herein, the placing and routing method comprises placing a first plurality of a standard tap well cell along a first direction, the standard tap well cell being formed by: routing a p-BIAS wire VPW and an n-BIAS wire VNW in a first a first metallization layer, and routing a power rail and a ground rail in a second metallization layer, the VPW and the VNW extending across each of the power and ground rail, wherein the VPWs of the first plurality of standard tap well cells are continuously connected and the VNWs of the first plurality of standard tap well cells are continuously connected.

19 Claims, 3 Drawing Sheets

(56) References Cited

U.S. PATENT DOCUMENTS

| | | | |
|---|---|---|---|
| 9,608,112 B2* | 3/2017 | Smith | H01L 21/743 |
| 9,698,179 B2* | 7/2017 | Smith | H01L 27/13 |
| 2006/0134853 A1 | 6/2006 | Shaw et al. | |
| 2010/0171155 A1* | 7/2010 | Saha | H01L 29/8086 |
| | | | 257/256 |
| 2011/0074498 A1* | 3/2011 | Thompson | H01L 21/823412 |
| | | | 327/543 |
| 2013/0093020 A1* | 4/2013 | Zhu | H01L 21/84 |
| | | | 257/347 |
| 2014/0173544 A1* | 6/2014 | Giraud | G06F 17/5068 |
| | | | 716/119 |
| 2015/0318407 A1 | 11/2015 | Chen et al. | |
| 2015/0364498 A1* | 12/2015 | Lukes | G06F 17/5068 |
| | | | 257/348 |
| 2017/0104005 A1* | 4/2017 | Haufe | H01L 27/1203 |
| 2017/0117366 A1* | 4/2017 | Thompson | H01L 29/1083 |
| 2017/0162557 A1* | 6/2017 | Moll | H01L 27/0222 |

OTHER PUBLICATIONS

Grenouillet et al.; "Ground plane optimization for 20nm FDSOI transistors with thin Buried Oxide"; Year: 2012; 2012 IEEE International SOI Conference (SOI); pp. 1-2.*

Examination Report from the Intellectual Property Office for Taiwan Application No. 106103800 dated Apr. 16, 2018.

* cited by examiner

PLACING AND ROUTING METHOD FOR IMPLEMENTING BACK BIAS IN FDSOI

BACKGROUND OF THE INVENTION

1. Field of the Invention

The present disclosure generally relates to a placing and routing method for implementing back bias in fully depleted silicon-on-insulator (FDSOI).

2. Description of the Related Art

Integrated circuits implemented in SOI technology offer a certain number of advantages. Such circuits generally have lower power consumption for equivalent performance and also cause lower parasitic capacitances, thereby improving the switching speed. Furthermore, the latch-up phenomenon encountered by CMOS transistors in bulk technology can be avoided in SOI technology. In addition, SOI integrated circuits are less sensitive to the effects of ionizing radiation and are thus more reliable in applications where such radiation can cause operating problems, notably in space applications. In general, SOI integrated circuits may include SRAM memory or logic gates.

As the doping of the channel in FDSOI technology is more or less zero (approx. $10^{15}$ cm$^{-3}$), the doping level of the channel of the transistors cannot reveal substantial variations preventing the threshold voltages from being differentiated in this way. In accordance with common approaches, transistors having different threshold voltages are implemented via the integration of different gate materials for these transistors. However, the practical implementation of an integrated circuit of this type is technically challenging.

In order to have different threshold voltages for different transistors in FDSOI technology, it is also known to use a biased ground plane arranged between a thin insulating oxide layer and the silicon substrate (known as "UTBOX technology"). By adjusting the doping and biasing of the ground planes, a range of threshold voltages can be defined for the different transistors. Accordingly, low threshold voltage transistors, known as "LVT" (typically 400 mV), high threshold voltage transistors, known as "HVT" (typically 550 mV), and medium threshold voltage transistors (typically 450 mV) may be realized for various applications.

It has been proposed to develop structures of FDSOI integrated circuits, where practical problems arise with any technological development relating to circuits of this type in that existing design tools may prove to be incompatible or may require substantial computing developments. Generally, the designers of electronic circuits use computer assisted design (CAD) for manufacturing semiconductor devices. In fact, large circuits are too complex to be designed manually and require appropriate computing tools, notably to avoid the risk of design errors. For current technology nodes, many parameters must be taken into account to avoid malfunction of circuits.

As used in the art, CAD uses a functional input specification. This functional specification describes the desired function of the circuit, as well as non-functional constraints (surface area, cost, power consumption, etc.). Moreover, CAD provides a representation of an integrated circuit in the form of an output computer file (generally in GDSII or, more recently, OASIS format). This computer file defines the drawings of masks of the integrated circuit to be implemented in such a way that these masks may be manufactured. The produced masks are then used for the production of the circuit in the semiconductor production units during photolithography steps.

CAD is divided into a plurality of steps: in a first step, the design and overall architecture of the integrated circuit is defined, starting with the functional specification of the circuit. The complete system (hardware and software) is modeled at a very high level in order to validate the performance of the chosen architecture in relation to the requirements of the application. Generally, the architecture of the integrated circuit is designed in Verilog, VHDL, SPICE, or other languages.

Then, an optimization step is carried out, known as floorplanning. This step entails the creation of a map of the placements of the logic gates on the chip, the sources and bondings, the inputs/outputs, and the microcircuits (complex components such as the process source, DSP, memories, etc.).

Subsequently, a logical synthesis of the circuit is carried out, wherein the circuit is modeled at register transfer level (RTL). This modeling describes the implementation of the integrated circuit in the form of sequential elements and logical combinations between different inputs/outputs of the sequential elements and primary inputs/outputs of the integrated circuit. The modeling provides a network made up of logic gates and rudimentary elements. This modeling is generally coated with a dedicated language, such a Verilog or VHDL. RTL modeling is automatically synthesizable into combinatorial (and, or, multiplexor gates, etc.) and sequential (synchronous D flip flops, etc.) logic gates originating from a standard cell library. The placement of the elements is not yet specified at this stage and occurs in the form of a list of elements necessary for performing the desired functions.

The logical synthesis is followed by a place and route step, during which the different components of the integrated circuit defined in the gate net list are automatically placed and connected according to the problem to be solved. In fact, the place and route process involves a difficult optimization problem that requires metaheuristic techniques.

The place and route step is then followed by the generation of the topography of the etching masks. During the logical synthesis of a circuit in UTBOX-FDSOI technology, in order to have as little impact as possible on the design process and the CAD tools already available, it is known to carry out a step of placing and routing of standard cells selected from a library including bulk technology components. Automated transformations are then carried out following this place and route step, to convert the circuit defined in bulk technology into a circuit in UTBOX-FDSOI technology. An automated transformation of this type can notably be carried out following the place and route step, in order to proceed with the generation of the topography of the etching masks, wherein a large number of parameters of the standard cells may be identical in bulk technology or in UTBOX-FDSOI technology.

The standard cells of such a library include, for the most part, a pair of an NMOS transistor and a PMOS transistor implemented in an upper layer of silicon of an FDSOI substrate. The silicon layer overhangs an insulating oxide layer of so-called ultrafine thickness, typically less than 50 nm. A ground plane or back gate is disposed under the oxide layer of the NMOS and a ground plane or back gate is disposed under the oxide layer of the PMOS. Each ground plane is biased via a respective well passing under a deep isolation trench. The threshold voltage of the transistors is adjusted notably by applying appropriate biasing voltages to the wells. In order to increase the possibilities for adjusting the threshold voltages, the doping of the ground plane can be of the n-type or p-type, for either the NMOS transistor or the PMOS transistor. The ground planes of the PMOS transistors are biased by an n-type doping well, whereas the ground planes of the NMOS transistor are biased by a p-type doping well.

Integrated circuits having tap cells for implementing a standard cell back bias architecture in bulk technologies are, for example, known from documents U.S. Pat. No. 6,560,753 B2, US 2015/0318407 A1, and US 2006/0134853 A1. A planar compatible FDSOI design architecture is known from document U.S. Pat. No. 8,443,306 B1.

In view of the above description, it is therefore desirable to implement a tap cell design for implementing a bias network in advanced FDSOI techniques without introducing too much complexity, such as additional routing steps, etc.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In an aspect of the present disclosure, a placing and routing method for implementing back bias in fully depleted silicon-on-insulator (FDSOI) is provided. In accordance with some illustrative embodiments herein, the placing and routing method comprises placing a first plurality of a standard tap well cell along a first direction, the standard tap well cell being formed by: routing a p-BIAS wire (VPW) and an n-BIAS wire (VNW) in a first metallization layer, and routing a power (VDD) rail and a ground (VSS) rail in a second metallization layer, the VPW and the VNW extending across each of the VSS rail and the VDD rail, wherein the VPWs of the first plurality of standard tap well cells are continuously connected and the VNWs of the first plurality of standard tap well cells are continuously connected.

BRIEF DESCRIPTION OF THE DRAWINGS

The disclosure may be understood by reference to the following description taken in conjunction with the accompanying drawings, in which.

Figure 1:
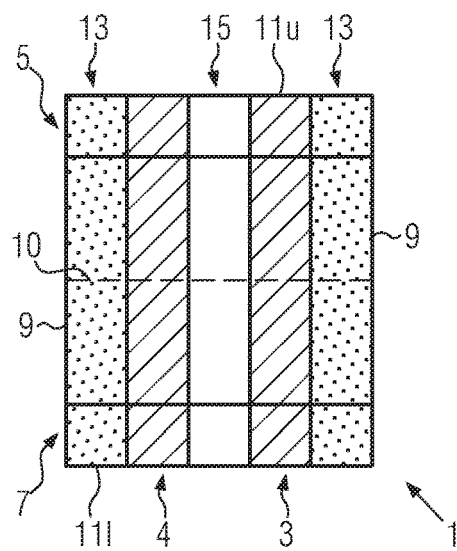
FIGS. 1 to 6 schematically illustrate, in top views, an example of a device region layout of FDSOI designs.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The person skilled in the art will appreciate that the figures are not drawn to scale.

The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase. For example, the person skilled in the art will appreciate after a complete reading of the present disclosure that the expression 'A over B' is not limited to the understanding that A is directly disposed on B, i.e., A and B being in physical contact.

The present disclosure may involve, in accordance with some illustrative embodiments of the present disclosure, the fabrication of semiconductor devices structures, such as a plurality of MOSFET or MOS devices integrated on a chip. When referring to MOS devices, the person skilled in the art will appreciate that, although the expression "MOS device" is used, no limitation to a metal-containing gate material and/or to an oxide-containing gate dielectric material is intended. Accordingly, a semiconductor device structure may be understood as comprising at least two MOS devices of at least one of a p-type and an n-type.

Semiconductor devices of the present disclosure may concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. After a complete reading of the present application, a person skilled in the art will appreciate that, according to the present disclosure, ground rules smaller or equal to 45 nm, e.g., at 22 nm or below, may be imposed. The present disclosure proposes semiconductor devices that may have structures of minimal length dimensions and/or width dimensions smaller than 100 nm, for example, smaller than 50 nm or smaller than 35 nm or smaller than 22 nm. For example, the present disclosure may provide semiconductor devices fabricated by using 45 nm technologies or below, e.g., 22 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

The person skilled in the art will appreciate that the expression 'SOI' is not intended as being limited to a special technique. In general, an SOI substrate may have an active semiconductor layer disposed on a buried insulating material layer, which, in turn, may be formed on a base substrate material. In accordance with some illustrative embodiments of the present disclosure, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like.

In accordance with at least some of the herein disclosed illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10 to about 30 nm. For example, in some special illustrative embodiments of the present disclosure, the active semiconductor layer may have a thickness of about 3 to about 10 nm.

As to a crystalline plane orientation of the base substrate material, similar to that of an ordinary silicon device, an SOI substrate having a surface with a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. In alternative embodiments, the base substrate material may be of an N-type when N-accumulation and/or N-inversion devices are considered (otherwise P-type for P-accumulation and/or P-inversion).

In the following, illustrative embodiments of a placing and routing method for implementing back bias in fully depleted silicon-on-insulator (FDSOI) are described. According to some illustrative embodiments, a standard tap well cell is provided, which standard tap well cell may be used in automatic place and route flows of FDSOI technology using back biasing techniques. Generally, back biasing may be employed in FDSOI techniques to decrease leakage and/or to increase performance. Herein, a back biasing voltage may be commonly supplied via contact positioned inside the standard tap well cell.

In bulk technology, tap cells are commonly connected to the power/ground mesh. However, in the FDSOI technology, the tap cells are used to connect the additional bias voltages implementing back bias by a connection from a bias route which is usually done in metallization layers. These routes are normally done using special routing features of place and route tools. However, simply extending routing and placing of tap cells, as known from bulk technology, to FDSOI technology in advanced FDSOI technology leads to additional routing steps and renders automatic place and route flows difficult to implement as routing rules have to be imposed for reflecting high voltage design rules suppressing DRC violations from being created at the chip level route.

In accordance with some illustrative embodiments of the present disclosure, a placing and routing method for implementing back bias in FDSOI techniques may comprise placing a first plurality of a standard tap well cell.

With regard to FIG. 1, a standard tap well cell 1 in accordance with some illustrative embodiments of the present disclosure is schematically illustrated in a top view. The standard tap well cell 1 has a pair of bias wires, a p-BIAS wire (VPW) 4 and an n-BIAS wire (VNW) 3. Furthermore, the standard tap well cell 1 comprises a power (VDD) rail 5 and a ground (VSS) rail 7. In accordance with the explicitly illustrated example as depicted in FIG. 1, the bias wires 3, 4 and the power/ground rails extend perpendicular to each other. This does not impose any limitation to the present disclosure and a skew arrangement of the bias wires 3, 4 with regard to the power/ground rails 5, 7 and/or a skew arrangement of the bias wires 3, 4 with regard to each other, may be implemented. Generally, bias wires and power/ground rails of a standard tap well cell in accordance with some illustrative embodiments of the present disclosure may extend across to each other.

In accordance with some illustrative embodiments of the present disclosure, the layout of the standard tap well cell 1 may comprise vertical edges 9, an upper edge 11*u*, and a lower edge 11*l*.

As depicted in FIG. 1, the bias wires 3, 4 may be routed within the standard tap well cell 1 in that a spacing of the bias wires 3, 4 with regard to the vertical edges 9 of the standard tap well cell 1 may be implemented in order to comply with predefined design rules, such as high voltage design rules. This does not pose any limitation to the present disclosure and the edges 9 may be slanted with regard to the upper and lower edges 11*u*, 11*l*.

In accordance with some illustrative embodiments of the present disclosure, the VDD rail 5 and the VSS rail 7 may extend parallel to the upper and lower edges 11*u*, 11*l* of the standard tap well cell 1, the VDD rail 5 being positioned at the upper edge 11*u*, while the VSS rail 7 may be arranged at the lower edge 11*l*. This does not pose any limitation to the present disclosure and the person skilled in the art will appreciate that the VDD rail 5 may be positioned at the lower edge 11*l*, while the VSS rail 7 may be located at the upper edge 11*u*.

In accordance with some illustrative embodiments of the present disclosure, the bias wires 3,4 may be drawn as orthogonal wires to the VDD and VSS rails 5, 7, possibly covering the standard tap well cell 1 from the top (at the upper edge 11*u*) to the bottom (at the lower edge 11*l*) of the standard tap well cell 1.

In accordance with some illustrative embodiments of the present disclosure, each of the bias wires 3, 4 may spaced apart from a respective one of the vertical edges 9 by a spacing 13, and the bias wires 3, 4 may be spaced apart from each other via a spacing 15. The spacing 15 and the spacing 13 may be selected in accordance with predefined design rules and/or geometric dimensions of at least one of the VPW 3, the VNW 4, and the standard tap of a geometric dimension of the standard tap well cell 1 (e.g. a dimension of at least one of the edges 9, 11*u*, and 11*l*).

A broken line 10 in FIG. 1 schematically illustrates an interface between ground layers of opposing conductivity types implemented into an underlying FDSOI substrate (not illustrated). In accordance with some illustrative examples, a p-type ground plane may be formed above the broken line 10 in FIG. 1, while an n-type ground plane may be formed in the FDSOI substrate below the broken line 10. For example, a p-type ground plane may be arranged close to the VDD rail 5, while an n-type ground plane may be arranged close to the VSS rail 7.

In accordance with some illustrative embodiments of the present disclosure, the bias wires 3, 5 may be routed in a first metallization layer, while the VDD rail 5 and the VSS rail 7 may be routed in a second metallization layer different from the first metallization layer. This does not pose any limitation to the present disclosure and the person skilled in the art will appreciate that the bias wires and the power/ground rails may be formed within the same metallization layer as will be described below with regard to FIG. 6.

In accordance with some special illustrative examples, the first metallization layer may be located within the metallization layers at a level lower (closer to an underlying substrate) than the second metallization layer. For example, the first metallization layer may be the lowermost metallization layer. The person skilled in the art will appreciate that implementing the first metallization layer in a lower metallization layer may avoid so-called "via wall" issues, wherein a minimization of "via wall" issues regarding the bias wires 3, 4 may achieved by arranging the bias wires 3, 4 in the same routing track.

In accordance with some illustrative embodiments of the present disclosure, the standard tap well cell 1 may be formed by drawing the bias lines 3, 4, and subsequently drawing the supply/ground rails 5, 7. This does not pose any limitation to the present disclosure and the supply/ground rails 5, 7 may be drawn before the drawing the bias lines 3, 4.

Figure 2:
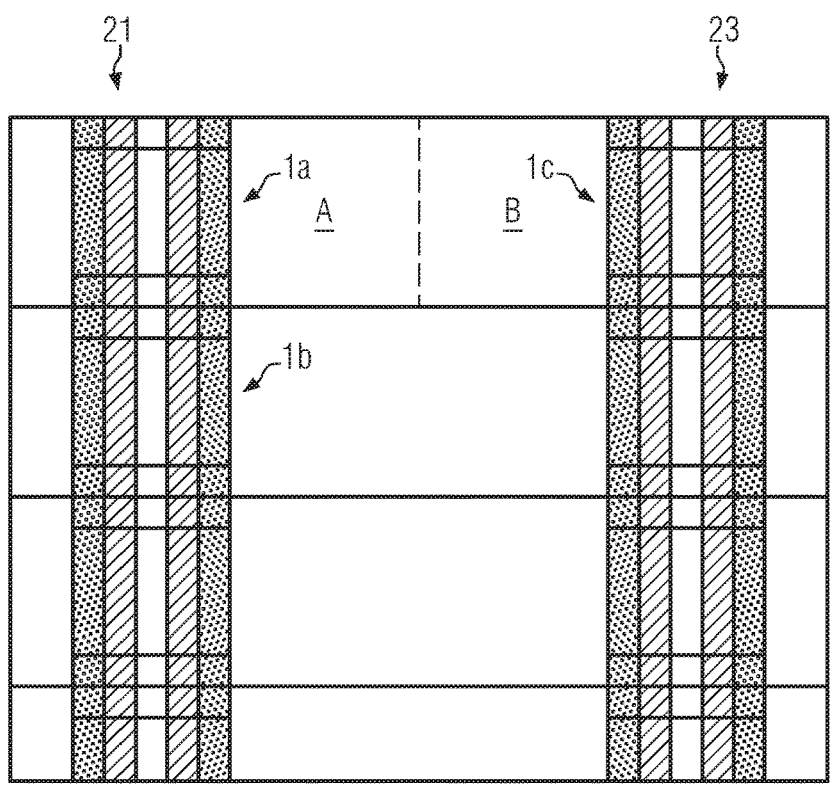

FIG. 2 schematically illustrates a connection of a bias network implemented by cell abutment of the standard tap well cells 2 in a way that the VPW 3 and the VNW 4, respectively, of abutting standard well cells are continuously connected. That is, the VPW 3 of two adjacent standard well cells 1a and 1b are continuously connected, and the VNW 4 of two adjacent standard well tap cells 1a and 1b are continuously connected. In accordance with some illustrative embodiments of the present disclosure, the abutting arrangement of standard tap well cells 1 may be achieved by arranging the abutting standard tap well cells in a column-shaped arrangement, as depicted in FIG. 2, wherein columns 21 and 23 are formed. Furthermore, additional columns may be provided, wherein corresponding tap well cells of different columns, such as of column 21 and of column 23, are separated by at least one transistor cell comprising at least one transistor element, e.g. transistor cells A, B as depicted in FIG. 2. The person skilled in the art will appreciate that, using the abutment approach of the standard tap well cell (c.f. standard tap well cell 1 in FIG. 1), a bias network may be automatically built and required routing rules for the bias network may be met. Herein, an optimal wire width and DFM requirements for vias (not illustrated) may be implemented into the cells.

After a complete reading of the present disclosure, the person skilled in the art will appreciate that, in cases where a proposed standard tap well cell design requires additional space to support predefined high voltage design rules or a predefined wire width, the design of the standard tap well cell may utilize the space to implement at least one additional decoupling capacitance into the standard tap well cell. The additional decoupling capacitance(s) may be added to improve the design power integrity.

With regard to FIG. 3, a further illustrative embodiment of the present disclosure will be described. Herein, a standard tap well cell 30 is schematically illustrated, the standard tap well cell 30 comprising a p-BIAS wire (VPW) 33, an n-BIAS wire (VNW) 34, a power (VDD) rail 35 and a ground (VSS) rail 37. Herein, the bias wires 33 and 34 may extend across each of the (VSS) rail 37 and the (VDD) rail 35, possibly skew with regard to each other. In this respect, the standard tap well cell 30 may be similar to the standard tap well cell 1 of FIG. 1.

Figure 3:
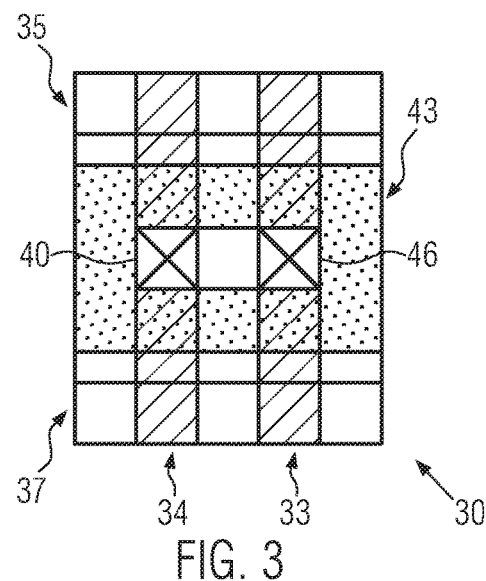

In the schematic illustration of FIG. 3, predefined design rules may be indicated by the dotted region 43 adjusting a spacing between via contacts 40, 46 (extending perpendicularly to the illustrated plane) relative to each other and the rails 35 and 37. The person skilled in the art will appreciate that predefined design rules, i.e., high voltage rules, may be more severe with an increasing height/level of the first metallization layer because a stacking of the vias 40, 46 down to the FDSOI substrate may need to strictly follow the high voltage DRC rules.

Figure 4:
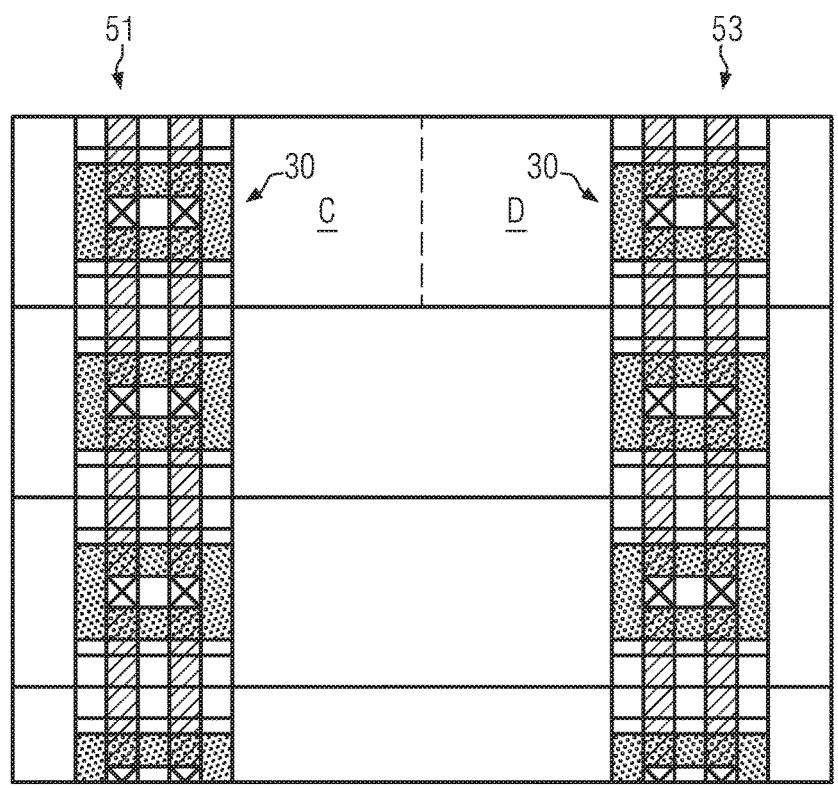

An abutment approach, similar to the illustration in FIG. 2, is schematically depicted in FIG. 4, where a first plurality of the standard tap well cells 30 is arranged in a first column 51, and a second plurality of the standard tap well cells 30 is arranged in a second column 53. Within each of the columns 51 and 53, the standard tap well cells 30 are arranged in an abutting configuration, wherein bias wires 34 and 33, respectively, are continuously connected along the respective columns 51 and 53. Similar to the configuration illustrated in FIG. 2, the columns 51 and 53 may be separated by at least one transistor cell, e.g., transistor cells C and D as depicted in FIG. 4.

The illustrative embodiments as depicted in FIGS. 1 and 2 versus FIGS. 3 and 4 differ in that the amount of routing tracks used in the embodiments of FIGS. 1 and 2 is much smaller than the amount of routing tracks used in the embodiments of FIGS. 3 and 4. Furthermore, upon following embodiments as described above with regard to FIGS. 3 and 4, a designer performing an according placing and routing method for implementing back bias in FDSOI techniques may need to pay more attention to high voltage design rules than when employing embodiments as described above with regard to FIGS. 1 and 2.

Figure 5:
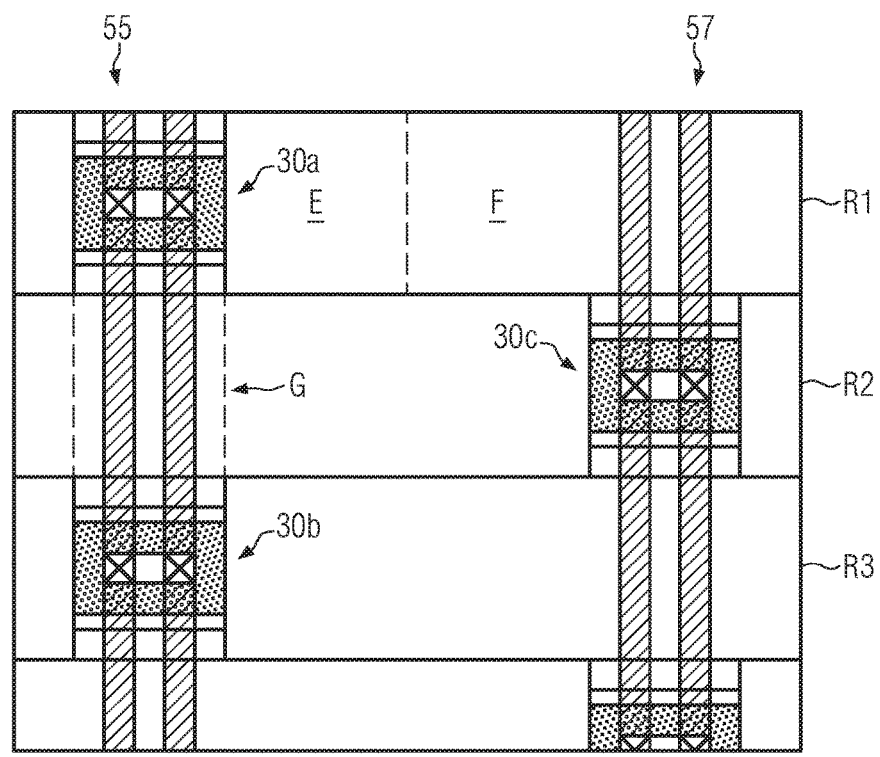

With regard to FIG. 5, an alternative arrangement of standard tap well cells 30 (or alternatively of standard tap well cells 1; not illustrated) is shown, where two adjacent standard tap well cells 30a and 30b, which are arranged in the same column, are separated by a further cell G, e.g., a transistor cell. Despite of lacking abutment of adjacent standard tap well cells, the bias wires VPW and VNW, respectively, are continuously connected similarly to the configurations illustrated in FIGS. 2 and 4. However, in the staggered arrangement of FIG. 5, although the routing tracks may be definitely lost, a designer may not be forced to follow high voltage rules as strict as applied in the embodiments as described above with regard to FIG. 4.

In accordance with some illustrative embodiments of the present disclosure as illustrated in FIG. 5, a plurality of columns 55 and 57 may be formed, where the standard tap well cells in each column may be provided by respective pluralities of standard tap well cells. Furthermore, the standard tap well cells of adjacent columns 55 and 57 may be displaced along a direction in which the columns 55 and 57 extend, such that two adjacent standard tap well cells 30a and 30b of column 55 may be separated from each other by an intermediate row R2 interposed between two rows R1 and R3 in which the adjacent standard tap well cells 30a and 30b of the column 55 are arranged. A standard tap well cell 30c of the adjacent column 57 may be located at the row R2, where no standard tap well cell is located adjacent to the row R2 in rows R1 and R3 of the column 57. In this manner, a staggered arrangement of the standard tap well cells in a plurality of columns may be implemented.

Similar to the configuration illustrated in FIG. 2, the columns 55 and 57 may be separated by at least one transistor cell, e.g., transistor cells E and F as depicted in FIG. 5.

With regard to the embodiment as described with regard to FIGS. 1 to 5, the first metallization layer may be a low metallization layer when compared to the second metallization layer. In accordance with some special illustrative examples herein, the first metallization layer may be the lower most metallization layer. In this case, the routing of the bias wires VPW and VNW may be included into the definition of standard cells and may release a user from speeding efforts on the physical routing and congestion topic.

With regard to FIG. 6, some illustrative embodiments of the present disclosure will be described, wherein the first metallization layer and the second metallization layer are located in the same metallization layer. Herein, a standard tap well cell 61 comprising a p-BIAS wire (VPW) 63 and an n-BIAS wire (VNW) 65 are located in the same metallization layer as a power (VDD) rail 67 and a ground (VSS) rail 69 such that the power and ground rails 67 and 69 are interrupted by the bias wires 63 and 65. Accordingly, the standard tap well cell 61 creates a power mesh breaking the horizontal VDD and VSS rails 67 and 69, wherein the bias wires 63, 65 extend perpendicularly to the VDD and VSS rails 67, 69.

Figure 6:
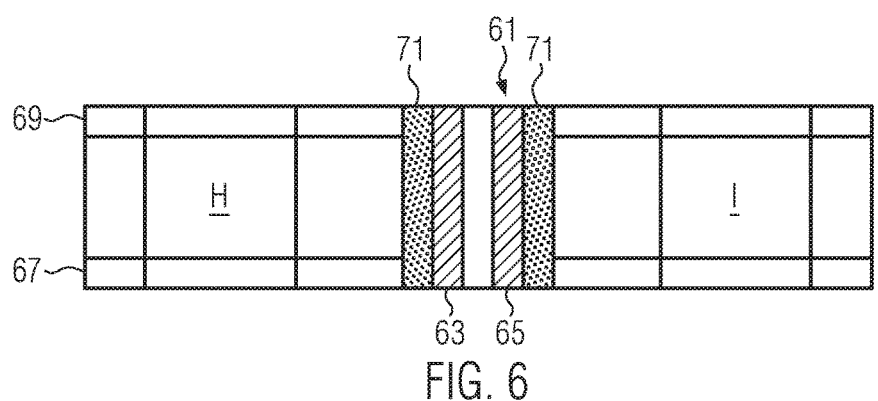

According to the illustration in FIG. 6, predefined design rules may be included as indicated by the doted regions 71. The person skilled in the art will appreciate that an abutment arrangement of the standard tap well cell 61 in accordance with illustration in FIG. 6 may be implemented similar to the abutment arrangement as depicted above in FIGS. 2 and 4, however, differing from those abutments in that the VDD and VSS rails 67 and 69 are interrupted by the bias wires 63 and 65. Nevertheless, a plurality of standard tap well cells 61 may be provided having bias wires 63 and 65 being continuously connected along the plurality of standard tap well cells. Embodiments as described above with regard to FIG. 6 may have the advantage that one routing less is consumed as compared to embodiments as described above with regard to FIGS. 1 to 5.

In accordance with some illustrative embodiments, standard transistor cells H and I may be arranged in a row and/or column comprising the standard tap well cell 61 adjacent to the standard tap well cell 61 as illustrated in FIG. 6. Accordingly, a back bias may be applied to the standard transistor cells H and I via the standard tap well cell 61.

With regard to the embodiments as described above, a first direction as referred to an aspect of the present disclosure may be understood as representing a direction along which each of the bias wires extend in the illustrations of FIGS. 1 to 6.

In accordance with some illustrative embodiments of the present disclosure, the bias wires VNW and VPW may be connected to a power supply (not illustrated) providing voltages to the VNWs and VPWs in accordance with a low power standby mode, a normal mode, and a high operating speed mode, and a VSS voltage may be supplied to the VSS rail and a VDD voltage may be supplied to the VDD rail.

In accordance with some illustrative examples herein, the VNWs may be biased at a voltage above the VDD voltage and the VPWs may be biased at a voltage below the VSS voltage during the low power standby mode.

In accordance with some illustrative examples, the VNWs may be biased at the VDD voltage and the VPWs may be biased at the VSS voltage.

In accordance with some illustrative examples, the VNWs may be biased at a voltage below the VDD voltage and the VPWs may be biased at a voltage above the VSS voltage.

After a complete reading of the present disclosure, the person skilled in the art will appreciate that embodiments, as described herein, may provide a biasing multi-operation mode implemented in FDSOI, where the ground planes of transistor devices may be adaptively biased as described above. In accordance with some biasing, the threshold voltage of NMOS and PMOS transistor devices may be increased, while in other biasing modes, the threshold voltage of NMOS and PMOS transistor devices may be decreased. A mode control signal may come from an external circuit of system (not illustrated).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method for forming a fully-depleted silicon-on-insulator (FDSOI) device, comprising:
    generating a layout for the FDSOI device by:
        placing a first plurality of a standard tap well cells for implementing back bias along a first direction, each of said standard tap well cells being formed by:
            routing a p-BIAS wire (VPW) and an n-BIAS wire (VNW) in a first metallization layer, and
            routing a power (VDD) rail and a ground (VSS) rail, said VPW and said VNW extending across each of said VDD rail and said VSS rail in a second metallization layer,
        wherein said VPWs of said first plurality of standard tap well cells are continuously connected, said VNWs of said first plurality of standard tap well cells are continuously connected, and said VPWs are separated from said VNWs by a predetermined distance with no intervening conductive wires routed between said VPWs and said VNWs along said predetermined distance; and
    fabricating the FDSOI device according to the layout.

2. The method of claim 1, wherein said VPWs and said VNWs extend perpendicular to said VSS and VDD rails.

3. The method of claim 1, further comprising placing standard transistor cells along said first direction among said first plurality, wherein at least one standard transistor cell is positioned between any two of said standard tap well cells of said first plurality.

4. The method of claim 1, further comprising placing standard transistor cells, wherein said standard tap well cells of said first plurality directly are placed in abutment to each other along said first direction, said VPWs and said VNWs, respectively, of adjacent standard tap well cells being in direct contact.

5. The method of claim 1, wherein said VPW and said VNW are routed within said standard tap well cell in compliance with at least one of predefined design rules and geometric dimensions of at least one of said VNW, said VPW, and said standard tap well cell.

6. The method of claim 1, wherein said first metallization layer is lower than said second metallization layer.

7. The method of claim 6, wherein said first metallization layer is the lowermost metallization layer.

8. The method of claim 1, wherein said first metallization layer and said second metallization layer are located at the same height level.

9. The method of claim 8, wherein said VSS and VDD rails are interrupted by said continuously connected VPWs and VNWs.

10. The method of claim 9, wherein said VSS and VDD rails are separated from said continuously connected VPWs and VNWs in compliance with at least one of predefined design rules and geometric dimensions of at least one of said VNW, said VPW, and said standard tap well cell.

11. The method of claim 1, wherein said standard tap well cell further comprises a VPW via contact and a VNW via contact, both of which being perpendicular to said first metallization layer, said VPW via contact and said VNW via contact being placed in dependence on said VNW and VPW and in compliance with at least one of predefined design rules and geometric dimensions of at least one of said VNW, said VPW, and said standard tap well cell.

12. The method of claim 11, wherein said VPWs and said VNWs are provided in the lower-most metallization layer, and said VPW via and said VNW via each contact a respective one of a p-type ground plane and an n-type ground plane formed in an FDSOI substrate.

13. The method of claim 1, further comprising placing a second plurality of standard tap well cells along said first direction, said second plurality being displaced relative to said first plurality along a second direction perpendicular to said first direction within said first metallization layer, wherein said VPWs of said standard tap well cells of said second plurality are continuously connected, and wherein said VNWs of said second plurality of standard tap well cells are continuously connected.

14. The method of claim 13, wherein said continuously connected VPWs and VNWs of said second plurality are substantially parallel to said continuously connected VPWs and VNWs of said first plurality.

15. The method of claim 13, further comprising placing standard transistor cells along said first direction among said second plurality, wherein at least one standard transistor cell is positioned between any two of said standard tap well cells of said second plurality.

16. The method of claim 15, wherein said standard tap well cells of said first plurality and said standard tap well cells of said second plurality are placed in a staggered arrangement relative to each other.

17. The method of claim 1, further comprising connecting said VNWs and VPWs to a power supply providing voltages to said VNWs and VPWs in accordance with a low power standby mode, a normal mode, and a high operating speed mode, and supplying a VSS voltage to said VSS rail and a VDD voltage to said VDD rail.

18. The method of claim 17, wherein, during said low power standby mode, said VNWs are biased at a voltage above said VDD voltage and said VPWs are biased at a voltage below said VSS voltage.

19. The method of claim 17, wherein, during said normal mode, said VNWs are biased at said VSS voltage and said VPWs are biased at said VSS voltage.

* * * * *